United States Patent [19]

Ikushima

[11] 4,375,037
[45] Feb. 22, 1983

[54] RECEIVING CIRCUIT

[75] Inventor: Ichiro Ikushima, Kokubunji, Japan

[73] Assignee: Hitachi, Ltd., Tokyo, Japan

[21] Appl. No.: 222,768

[22] Filed: Jan. 6, 1981

[30] Foreign Application Priority Data

Jan. 7, 1980 [JP] Japan ........................................ 55-170

[51] Int. Cl.$^3$ ........................ H03K 5/08; H03K 5/153; H03K 5/24
[52] U.S. Cl. ..................................... 307/268; 307/358; 328/147; 328/164; 340/146.3 AC; 340/146.3 AG
[58] Field of Search ............... 307/268, 351, 354, 356, 307/358, 311; 328/151, 164, 147; 340/146.3 AC, 146.3 AG

[56] References Cited

U.S. PATENT DOCUMENTS 3,909,594  9/1975  Allais et al. ............... 340/146.3 AG
4,121,121 10/1978  Gabeler et al. ...................... 307/351
4,241,455 12/1980  Eibner .................................. 307/351

Primary Examiner—John Zazworsky
Attorney, Agent, or Firm—Antonelli, Terry and Wands

[57] ABSTRACT

In a receiving circuit wherein a digital input signal is compared with a reference voltage and is regenerated into a pulse information signal of "1" or "0" value, a circuit for producing the reference voltage is constructed of a peak detector circuit which detects the maximum value of the output of a preprocessing circuit for the input signal, a reference preprocessing circuit which has the same circuit arrangement as that of the first-mentioned preprocessing circuit except for receiving no input signal, and a voltage divider circuit which divides the sum of the output of the peak detector circuit and an output of the reference preprocessing circuit. With such an arrangement, even when the amplitude of the input digital signal has fluctuated, a pulse signal whose pulse width is subjected to substantially no variation can be regenerated by means of the simple circuitry.

10 Claims, 12 Drawing Figures

RECEIVING CIRCUIT

BACKGROUND OF THE INVENTION

This invention relates to a receiving circuit. More particularly, it relates to a receiving circuit which compares an input digital signal with a reference voltage thereby to discriminate the pulse signal and to provide a pulse signal with its waveform regenerated.

A receiving circuit for digital signals typically includes means to regenerate the incoming pulse signal which has been distorted in the course of transmission, to its original signal waveform. In order to perform the regeneration operation precisely, it is a common practice to extract a timing signal from the received pulse signals and to regenerate the received signals while synchronizing them with the timing signal.

However, it is sometimes desirable to use a receiving circuit which is operable irrespective of the bit rate of the digital signals or to take steps in the design of the circuit arrangement or apparatus to make it simple and economical. In this regard, there has been known a receiving circuit which discriminates whether the level of the input pulse signal is greater or smaller than a reference value and which regenerates as the output pulse signal a signal having a pulse height that is not smaller than the reference value. In this case, when the reference voltage is fixed, the width of the regenerated pulse varies due to the distortion of the input pulse signal, especially the fluctuation of the level, and the variation of the pulse width forms a cause for the malfunction of a signal processing circuit disposed at a succeeding stage. Particularly, in the case of optical communication, a photodetector undergoes a temperature variation and the transmission is carried out at a high bit rate, so that the variation of the width of the regenerated pulse causes a bit error to drastically degrade the quality of the communication.

Heretofore, in order to solve such a problem, it has been proposed to set the reference voltage by detecting and holding the peak value of the input pulse and dividing the detected peak value into the reference voltage. This prior art method is effective, but inconveniences occur in the case where a preprocessing circuit, such as photodetector and preamplifier, is disposed in the front part of the receiving circuit. By way of example, in the case where one-half of the peak value of a high level corresponding to an input signal "1" is used as the reference voltage (threshold level), when the input potential of a signal "0" does not become zero or fluctuates due to the dark current of the photodetector, etc., the reference voltage might become lower than the input voltage corresponding to the signal "0". Moreover, the width of the pulse of the signal "1" which ought to become equal to or greater than the reference voltage might vary due to the fluctuation of the input voltage corresponding to the signal "0".

SUMMARY OF THE INVENTION

It is accordingly an object of this invention to provide an improved receiving circuit which discriminates whether an input digital signal is "1" or "0" by comparing a pulse thereof with a reference voltage and which regenerates a pulse on the basis of the discrimination.

It is another object of the present invention to provide a circuit of the type described which includes a receiving circuit which can regenerate the pulse from the input digital signal without producing a great variation in its pulse width irrespective of the level fluctuation of the input signal.

In order to accomplish these objects, according to the invention, in a receiving circuit having an input signal preprocessing circuit, a reference voltage composition circuit which forms a reference voltage by utilizing an output of the preprocessing circuit, and a comparator circuit which detects and regenerates a pulse signal by comparing the output voltage of the preprocessing circuit with the reference voltage, the reference voltage composition circuit is constructed of a peak detector circuit for detecting the maximum value of the output of the preprocessing circuit, a reference preprocessing circuit having the same characteristic as that of the first-mentioned preprocessing circuit, and a voltage divider circuit for dividing the sum of the output voltage of the peak detector circuit and the output voltage of the reference preprocessing circuit. Here, the "preprocessing circuit" shall include a photoelectric transducer or a preamplifier and circuits belonging thereto. The "reference preprocessing circuit having the same characteristic" signifies that both the preprocessing circuits are based on an identical operating principle, and this expression shall include also a case where some differences are intentionally afforded in numerical values.

According to the receiving circuit of this invention, the reference preprocessing circuit is used, which has the same operation and characteristic as those of the preprocessing circuit to which an input signal is applied. In principle, therefore, the reference voltage is set at a magnitude obtained by dividing the sum between a voltage at the time of the input signal "0", i.e., an offset voltage as well as a voltage corresponding to the input signal "0", and a voltage at the time of the input signal "1", i.e., the offset voltages as well as a voltage corresponding to the input signal "1". Accordingly, the offset voltage is canceled in the comparator circuit, and the reference voltage is appropriately set. These facts bring forth the advantage that the width of the regenerated pulse does not greatly vary due to the amplitude of the input signal. In addition, the offset voltage of the input signal of the comparator circuit need not be eliminated before the comparison. This facilitates the design of the preamplifier. In other words, the output of the preamplifier may well generate a fixed voltage even when the input signal is "0".

The above-mentioned and other objects and features of this invention will become more apparent from the following description taken with reference to the accompanying drawings.

DESCRIPTION OF THE PREFERRED EMBODIMENTS

Figure 1:
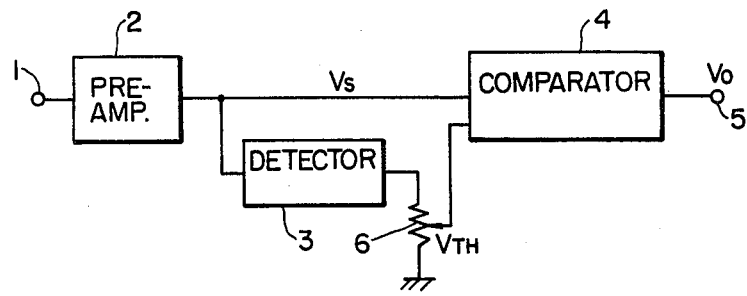
FIG. 1 is a block diagram of a prior art receiving circuit.
Figures 2A, 2B, 2C:
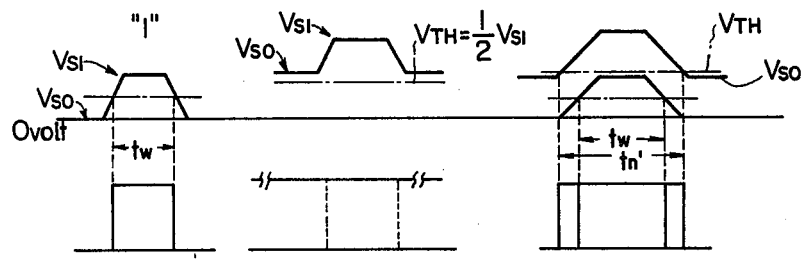
FIGS. 2A, 2B and 2C are waveform diagrams of signals for explaining problems of the prior art circuit.

First, a prior art receiving circuit will be described in order to facilitate understanding of this invention. FIG. 1 shows the prior art circuit for detecting and regenerating a pulse signal. An input signal applied to an input terminal 1 is amplified by a preamplifier 2, and the amplified signal $V_S$ is applied to a voltage comparator circuit 4 and is compared with a reference voltage $V_{TH}$ therein. A voltage $V_{SM}$ detected by a peak detector circuit 3 is divided by a voltage divider 6, and the reference voltage $V_{TH} = \frac{1}{2} V_{SM}$ is obtained. This is effective to reduce the variation of a regenerated pulse width ascribable to the fluctuation of the amplitude of the input signal voltage. However, when the input digital signal is a "0" from an information point of view, the actual input potential cannot be made zero on account of restrictions on the circuit arrangement of the preamplifier 2 or due to the influences of dark current, etc., in the case of converting an input light signal into an electric signal by means of a photodetector in an optical communication system, for example. As illustrated in FIG. 2A, if the output voltage $V_{SO}$ of the preprocessing circuit is zero volt for the information input signal "0", this input signal will be discernible from an input signal "1". In actuality, however, when the fixed voltage $V_{SO}$ is great for the input signal "0", the reference voltage $V_{TH}$ becomes lower than $V_{SO}$ as shown in FIG. 2B, resulting in a malfunction. Further, as illustrated in FIG. 2C, the reference voltage $V_{TH}$ varies depending upon the voltage $V_{SO}$ corresponding to the input signal "0", and the width $t_w$ of the regenerated pulse fluctuates.

Figure 3:
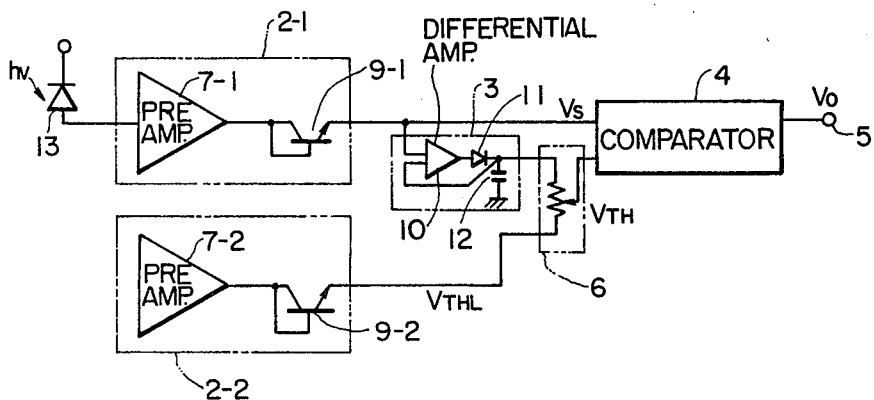
FIGS. 3, 5 and 7 are block diagrams each showing the construction of an embodiment of a receiving circuit according to this invention.

FIG. 3 is a circuit diagram showing the construction of an embodiment of a receiving circuit according to this invention, specifically, a receiving circuit which may form part of an optical communication system. A light signal hv transmitted by an optical fiber or the like is converted into an electric signal by a photodetector 13, such as a photodiode. The electric signal is applied to a voltage comparator circuit 4 via a preprocessing circuit 2-1 which consists of a preamplifier 7-1 and a diode-connected transistor 9-1.

A peak detector circuit 3 holds the maximum value $V_{SM}$ of an output of the transistor 9-1 for a fixed period of time. It is constructed of a differential amplifier 10, and a diode 11 and a capacitor 12 are connected to an output terminal of the amplifier 10.

In order to generate a reference voltage corresponding to a signal "0", a reference preprocessing circuit 2—2 is provided which has the same circuit composition as that of the preprocessing circuit 2-1 and which consists of a preamplifier 7-2 and a diode-connected transistor 9-2. A voltage divider circuit 6 is constructed of a resistance element, and it composes the reference voltage from an output voltage of the peak detector circuit 3 and an output voltage of the reference preprocessing circuit 2—2. Now, letting $V_{SM}$ denote the output voltage of the peak detector circuit and $V_{THL}$ denote the output voltage of the reference preprocessing circuit 2—2, and supposing the voltage division ratio of the resistance element to be $\frac{1}{2}$, the reference voltage $V_{TH}$ becomes:

$$V_{TH} = \frac{1}{2}(V_{SM} + V_{THL})$$

In the present embodiment, the emitter area of the transistor 9-1 is made smaller than that of the transistor 9-2, whereby the emitter-base voltage $V_{BE}$ of the transistor 9-1 is made higher than that $V_{BE'}$ of the transistor 9-2. With this measure, $(V_{BE} - V_{BE'})$ can be accurately set in dependence on the emitter areas. Therefore, when the information input signal is "0", the input signal voltage $V_{SO}$ to the comparator circuit 4 can be made somewhat lower than the reference voltage $V_{THL}$. Accordingly, it can be reliably decided in any case that the input signal is "0". The comparator circuit 4 may be provided in any known form, and, for example, may be constructed by combining a differential amplifier and an output amplifier in the known way (the same applies to embodiments to be described later). The detailed description of the comparator circuit is therefore omitted.

Figure 4:
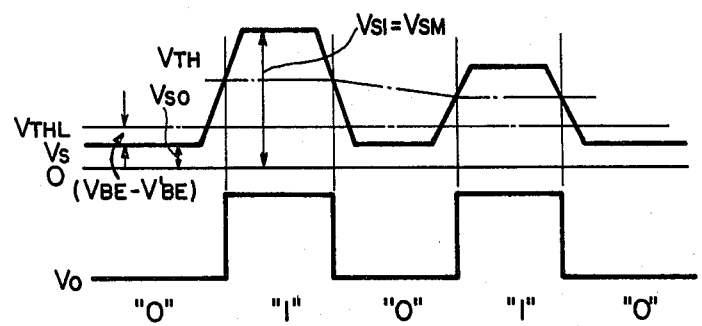
FIG. 4 is a waveform diagram for explaining the operation of the embodiment shown in FIG. 3.

FIG. 4 is a waveform diagram showing the relationship among the input signal level $V_S$, the reference voltage $V_{TH}$ and the output voltage $V_O$ in the above embodiment. As apparent from the figure, even when the voltage level $V_{SO}$ of the preprocessing circuit corresponding to the input signal "0" has fluctuated and when the voltage level $V_{SM}$ of the preprocessing circuit corresponding to the information input signal "1" has fluctuated, the reference voltage $V_{TH}$ is set at approximately $\frac{1}{2}$ of an amplitude variation $(V_{SM} - V_{SO})$, and hence, the variation of the width of the output pulse attributed to the signal amplitude is improved. Regarding the reference voltage $V_{THL}$ corresponding to the information input signal "0", since the preprocessing circuit 2-1 and the reference preprocessing circuit 2—2 are constructed of circuit arrangements having the same characteristics, $(V_{THL} - V_{SO})$ becomes equal to $(V_{BE} - V_{BE'})$, and the drift and fluctuation of the signal ascribable to a temperature change and a current change can be canceled, thereby to construct a stable receiving circuit, i.e., a receiving circuit which accurately discriminates the information input signal between "0" and "1" and which undergoes substantially no variation in regenerated pulse width.

Figure 5:
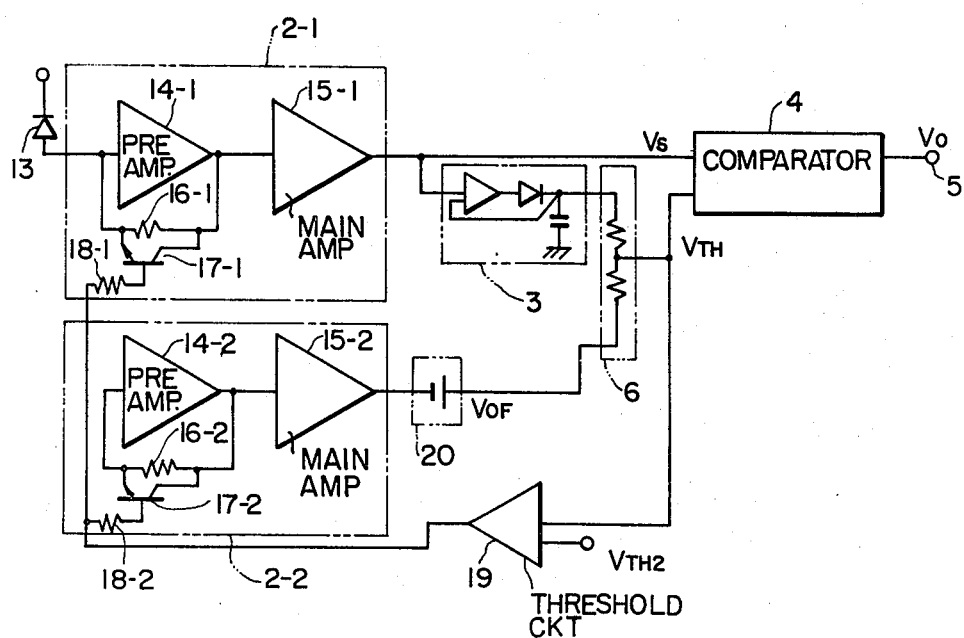

FIG. 5 is a circuit diagram of another embodiment of the receiving circuit according to this invention. In the figure, parts assigned the same numerals as in FIG. 3 are circuits which have substantially the same arrangements and perform substantially the same operation as those in FIG. 3.

In the present embodiment, the preprocessing circuit 2-1 consists of a preamplifier circuit 14-1 and a main amplifier 15-1, and the pre-amplifier circuit includes a negative feedback circuit which is formed of a resistor 16-1 connected across the emitter and collector of a transistor 17-1. The arrangement of the reference preprocessing circuit 2—2 is the same as that of the preprocessing circuit 2-1 as stated above, and includes a preamplifier circuit 14-2, a main amplifier 15-2, a resistor 16-2 and a transistor 17-2. The bases of the transistors 17-1 and 17-2 of the negative feedback circuits are connected by resistors 18-1 and 18-2, respectively, to the output of a threshold circuit 19 having two inputs, i.e., $V_{TH}$ and another reference voltage $V_{TH2}$. Thus, when the voltages applied to the bases have risen, currents flowing through the transistors increase to equivalently reduce the resistance values of the feedback resistors 16-1 and 16-2 and lower the outputs of the preamplifiers 14. The output voltage of the reference preprocessing circuits 2—2 is coupled to the voltage divider circuit 6 through a voltage source 20 which adds a minute voltage to the output voltage.

Figure 6:
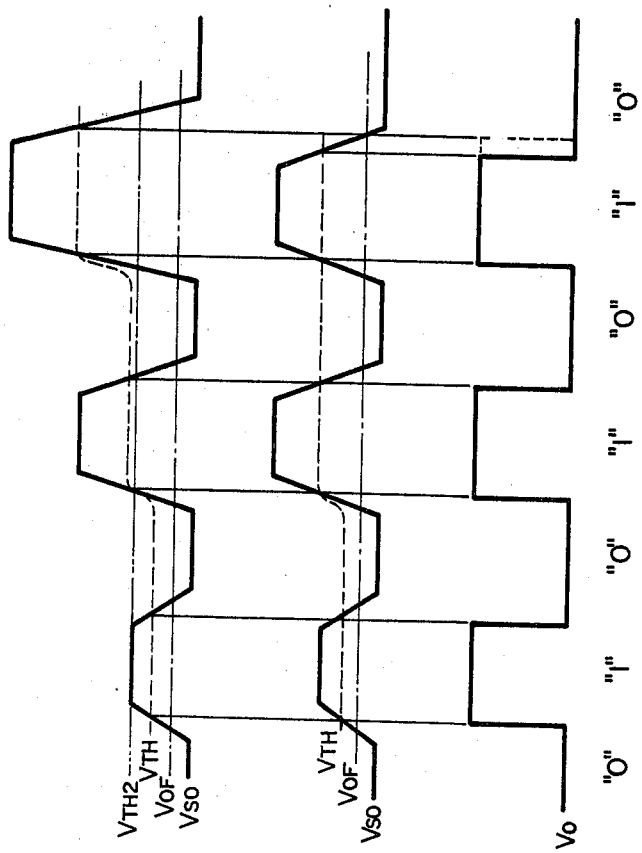
FIGS. 6A, 6B and 6C are waveform diagrams for explaining the operation of the embodiment shown in FIG. 5.

Referring now to the waveform diagrams of FIGS. 6A-6C, the operation of this circuit will be described. FIG. 6A shows the signal $V_{SO}$ (solid line) and the reference voltage $V_{TH}$ (dotted line) in the absence of the circuit of the feedback from the voltage divider circuit 6 through the threshold circuit 19 to the transistors 17-1 and 17-2. In order to facilitate the description, the threshold level $V_{TH2}$ (two-dot chain line) and the voltage $V_{OF}$ of the voltage source 20 (one-dot chain line) are superposed in the illustration. For comparisons' sake, waveforms of three information signals "1" of unequal amplitudes and corresponding to intervening information signals "0" are also illustrated in a joined fashion.

Assuming that the voltage division ratio of the divider circuit 6 is $\frac{1}{2}$, the reference voltage $V_{TH}$ is $\frac{1}{2}$ of the sum between the maximum output voltage $V_{SM}$ ($=V_{SI}+V_{SO}$) of the preprocessing circuit 2-1 and the output voltage $V_{SO}$ of the reference preprocessing circuit 2—2 with the voltage $V_{OF}$ of the offset voltage source 20 added thereto and therefore becomes:

$$V_{TH} = \tfrac{1}{2}(V_{SM} + V_{SO} + V_{OF})$$
$$= V_{SO} + \tfrac{1}{2}(V_{SI} + V_{OF})$$

where $V_{SM}=V_{SI}+V_{SO}$, $V_{SI}$ denotes a voltage corresponding to the information signal "1", and $V_{SO}$ denotes a voltage corresponding to the information signal "0".

Accordingly, when the information signal is "0", the reference voltage $V_{TH}$ becomes higher than the voltage $V_{SO}$, and the voltage comparator circuit 4 discriminates the information signal "0" correctly irrespective of the offset or drift of the preprocessing circuit. On the other hand, when the information signal is "1" and its level changes, the voltage $V_{SI}$ fluctuates in the above expression and therefore the reference voltage $V_{TH}$ varies as greatly as illustrated by the dotted line in FIG. 6A under the condition of the present discussion that the preamplifiers 2-1 and 2—2 do not include the feedback circuits. In contrast, according to the circuit of the present invention, when the amplitude of the input information signal "1" has risen to render the reference voltage $V_{TH}$ higher than the reference voltage $V_{TH2}$ of the threshold circuit 19, a voltage amplifier comprising the threshold circuit 19 amplifies the difference voltage of ($V_{TH}-V_{TH2}$), and the amplified voltage is applied to the base electrodes of the transistors 17-1 and 17-2 of the feedback resistance circuits so as to bring these transistors into the conductive states. Thus, the resistances of the feedback resistors 16-1 and 16-2 are equivalently lowered, and the output voltages of the preamplifier circuits 14-1 and 14-2 are lowered. That is, an automatic gain control (AGC) operation is effected. D.C. voltage variations due to the AGC operation appear in the same phase in both the amplifier circuits 14-1 and 14-2, and therefore, have no influence on the voltage comparator circuit 4. Accordingly, the input reference voltage of the comparator circuit 4 and the input signal voltages become as shown in FIG. 6B, and even when the amplitude of the input signal voltage has fluctuated, the variation of the width of the pulse signal, at the time when it becomes equal to or higher than the reference voltage $V_{TH}$, is conspicuously suppressed.

Since the arrangements of the preamplifier circuits of the signal system and the reference system are the same, both their output voltages drift or fluctuate similarly even in the presence of a temperature change and/or a supply voltage fluctuation, and hence, these drifts or fluctuations are canceled by the comparator circuit 4.

Figure 7:
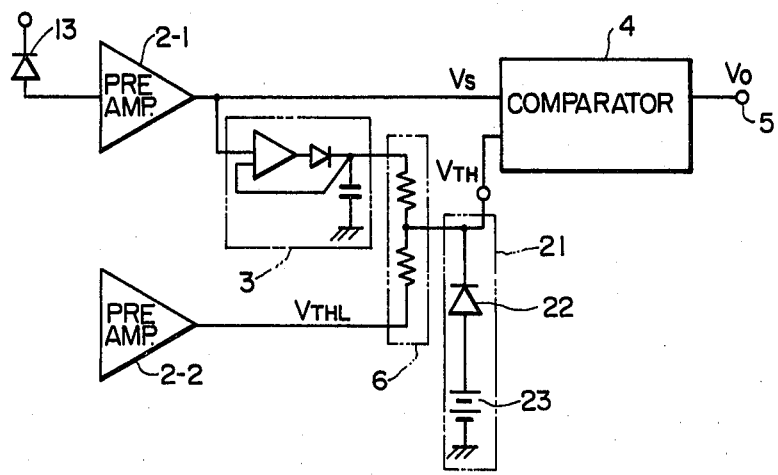

FIG. 7 shows a circuit diagram of still another embodiment of the receiving circuit according to this invention. The present embodiment is characterized in that the refernece voltage composition circuit is especially constructed by disposing a threshold circuit 21, which consists of a diode 22 and a constant-voltage source 23, at an output part of the voltage divider circuit which divides the sum of the output voltage of the signal peak detector circuit 3 and the output voltage of the reference preprocessing circuit 2—2. In the figure parts which are substantially the same in construction and operation as in the foregoing embodiments are assigned the same numerals as those of the corresponding parts in the drawings, and they are not repeatedly described in detail.

Figure 8:
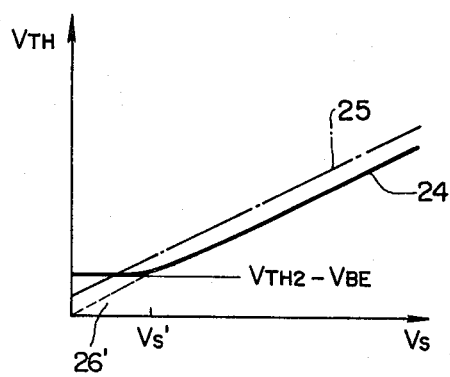
FIG. 8 is a diagram showing the relationship between the input signal and the reference voltage for explaining the operation of the embodiment shown in FIG. 7.

FIG. 8 is a diagram for explaining the relationship between the reference voltage $V_{TH}$ and input signal $V_S$ of the comparator 4. In the figure the abscissa represents the amplitude $V_S$ of the pulse corresponding to the input signal "1", while the ordinate represents the reference voltage $V_{TH}$. A solid line 24 indicates a characteristic of the embodiment shown in FIG. 7, a one-dot chain line 25 a characteristic in the case where the offset voltage is applied to the reference preprocessing circuit without additionally providing the diode 22 as well as the offset voltage source 23, and a segment 26 is a characteristic in the case of the prior art receiving circuit in FIG. 1. As apparent from FIG. 8, in the case where the input signal is below $V_S$, the reference voltage $V_{TH}$ is clamped to ($V_{TH2}-V_{BE}$) by the voltage $V_{TH2}$ of the offset voltage source 23 and the forward voltage $V_{BE}$ of the diode 22. Accordingly, the comparator circuit 4 can reliably decide that signals below ($V_{TH2}-V_{BE}$) are "0" information signals. On the other hand, when the output of the voltage divider circuit 6 is equal to or greater than the voltage ($V_{TH2}-V_{BE}$), the reference voltage becomes $\tfrac{1}{2}(V_{SM}+V_{THL})$ on the assumption that the voltage division ratio is $\tfrac{1}{2}$. Here, $V_{SM}=V_{SO}+V_{SI}$ and $V_{THL}=V_{SO}$, so that the reference voltage $V_{TH}$ becomes ($V_{SO}+\tfrac{1}{2}V_{SI}$). For the same reason as described before, the influence of the drift component of the input signal is eliminated, and the reference voltage is set in the middle of the amplitude of the information signal "1". Therefore, regenerated pulses have little pulse width variation due to any change in the signal amplitude.

As described above in conjunction with the preferred embodiments, the reference voltage composition circuit is constructed so as to divide the sum of the peak value of the input signal and the output of the reference preprocessing circuit, thereby to realize a pulse signal receiving circuit in which the pulse width of the regenerated pulse experiences little variation due to variations in the amplitude of the input signal, the operation of which is not affected by temperature changes and which can reliably discriminate the information signal "0" from noise, drift, etc.

While I have shown and described several embodiments in accordance with the present invention, it is understood that the invention is not limited to the details described herein but is susceptible of numerous changes and modifications as obvious to one of ordinary skill in the art, and I therefore do not wish to be limited to the details shown and described herein but intend to cover all such changes and modifications obvious to those skilled in the art.

What is claimed is:

1. A receiving circuit for detecting and regenerating a pulse signal, comprising a preprocessing circuit having a predetermined circuit composition which receives digital signals having low and high amplitude valves as input signals, a reference voltage circuit which produces a reference voltage on the basis of the output signal of said preprocessing circuit, and a comparator circuit which compares the output signal of said preprocessing circuit with said reference voltage for regenerating said digital signals, said reference voltage circuit comprising a peak detector circuit connected to the output of said preprocessing circuit for detecting the maximum value of the output of said preprocessing circuit, means including a reference preprocessing circuit which has the same circuit composition as that of said first-mentioned preprocessing circuit and to which no input signal is applied for producing an output voltage having a predetermined relationship to said low amplitude value of said input signals, and a voltage divider circuit which divides the sum of the output voltage of said peak detector circuit and the output voltage of said reference preprocessing circuit, the divided output of said voltage divider circuit being applied as said reference voltage to said comparator circuit along with the output of said first-mentioned preprocessing circuit.

2. A receiving circuit according to claim 1, further comprising a photodetector connected to an input terminal of said first-mentioned preprocessing circuit.

3. A receiving circuit according to claim 1, wherein said peak detector circuit includes a differential amplifier whose output terminal is connected to a diode and which receives at respective inputs said output signal of said first-mentioned preprocessing circuit and the output of said diode, and a capacitor which is connected between the output of said diode and ground.

4. A receiving circuit according to claim 1, wherein said first-mentioned preprocessing circuit comprises a preamplifier circuit and a first transistor which is diode-connected between said preamplifier circuit and one input of said comparator circuit, while said reference preprocessing circuit consists of a reference preamplifier circuit and a second transistor which is diode-connected between said reference preamplifier circuit and said voltage divider circuit.

5. A receiving circuit according to claim 4, wherein said first-mentioned and said reference preprocessing circuits are fabricated as integrated circuits, and wherein the emitter area of said second transistor is made larger than that of said first transistor.

6. A receiving circuit according to claim 1, wherein both said first-mentioned preprocessing circuit and said reference preprocessing circuit comprise respective preamplifier circuits with feedback resistors having the same characteristics and circuit means for controlling the current through feedback resistors on the basis of said reference voltage.

7. A receiving circuit according to claim 6, wherein said reference voltage circuit further includes a constant-voltage source connected between said reference preprocessing circuit and voltage divider circuit which adds a minute voltage to said output voltage of said reference preprocessing circuit.

8. A receiving circuit according to claim 6, wherein said circuit means includes a respective feedback control transistor connected across each feedback resistor and a threshold amplifier having an output connected to control said feedback control transistors and a pair of inputs connected to receive said reference voltage and an additional reference voltage, respectively.

9. A receiving circuit according to claim 1, wherein said voltage divider circuit includes a threshold circuit which generates a predetermined output voltage when the divided output is not greater than a predetermined value.

10. A receiving circuit according to claim 9, wherein said threshold circuit includes a diode and a voltage source in series.